United States Patent [19]

Goossen

[11] Patent Number: 5,510,291

[45] Date of Patent: Apr. 23, 1996

[54] METHOD OF MAKING SURFACE-NORMAL SEMICONDUCTOR OPTICAL CAVITY DEVICE

[75] Inventor: Keith W. Goossen, Aberdeen, N.J.

[73] Assignee: AT&T Corp., Murray Hill, N.J.

[21] Appl. No.: 236,618

[22] Filed: May 2, 1994

[51] Int. Cl.$^6$ .................................................. H01L 21/20
[52] U.S. Cl. ............................................ 437/129; 437/108
[58] Field of Search ................................... 359/248, 260, 359/276; 257/21, 98, 432, 436; 372/45, 50, 92, 96; 437/129; 117/108

[56] References Cited

PUBLICATIONS

R. H. Yan et al, "Electroabsorptive Fabry–Perot Reflection Modulators with Asymmetric Mirrors", Sep. 1989, pp. 273–275, IEEE Photonics Technology Letters, vol. 1, No. 9.
J. L. Jewell et al, "Low–Threshold Electrically Pumped Vertical–Cavity Surface–Emitting Microlasers", Aug. 17, 1989, pp. 1123–1124, Electronics Letters, vol. 25, No. 17.

*Primary Examiner*—R. Bruce Breneman
*Assistant Examiner*—Linda J. Fleck

[57] ABSTRACT

A multi-layer mirror structure included in a surface-normal semiconductor optical cavity is fabricated in a deposition reactor dedicated to that purpose alone. Additional layers of the device are subsequently deposited on top of the mirror structure in a second reactor. In practice, the dedicated reactor produces layers whose thickness variations over their entire extents are considerably less than the thickness variations of layers made in the second reactor. This coupled with the fact that the actual achieved thickness of the mirror structure can be conveniently measured before commencing deposition of a prescribed thickness of the additional layers makes it possible to fabricate a specified-thickness optical cavity within tight tolerances in a high-yield manner.

11 Claims, 2 Drawing Sheets

METHOD OF MAKING SURFACE-NORMAL SEMICONDUCTOR OPTICAL CAVITY DEVICE

BACKGROUND OF THE INVENTION

This invention relates to semiconductor devices and, more particularly, to a method for fabricating surface-normal semiconductor optical cavity devices. Considerable effort has recently been directed to the development of surface-normal semiconductor optical cavity devices such as surface-emitting lasers and asymmetric Fabry-Perot modulators. For a description of a typical such device, see, for example, "Electroabsorptive Fabry-Perot Reflection Modulators with Asymmetric Mirrors", by R. H. Yan et al, *IEEE Photonics Technology Letters*, Vol. 1, No. 9, pages 273–275, September 1989.

In contrast With edge-emitting or waveguide-type optical devices, surface-normal optical devices of the type described in the aforecited article lend themselves relatively easily to the formation of two-dimensional arrays. Such arrays are useful in a variety of practical applications such as optical interconnects, laser printers and smart-pixel systems.

A typical surface-normal semiconductor optical cavity device includes a multi-layer mirror structure on top of which is formed a multi-layer gain region (for a laser) or a multi-layer electroabsorptive region (for a modulator). Another mirror is then formed on top of the gain or electroabsorptive region. An optical cavity, exhibiting resonance at a prespecified wavelength, is thereby formed in the device, as is well known in the art.

To achieve a good-quality surface-normal semiconductor optical device, it is essential that the thicknesses of the layers constituting the optical cavity be fabricated with good precision and accuracy. In actual devices, the thicknesses of the layers of the cavity must, for example, often be controlled over their entire extents to vary less than one percent from prescribed thickness values.

In practice, a shift in the overall thickness of the cavity layers of such a device by one percent causes a corresponding shift of one percent in the cavity resonance. For a device designed, If or example, to operate at a wavelength of 850 nanometers (nm), such a thickness variation would thus cause a shift of 8.5 nm in the resonance wavelength. In many cases, such a shift is comparable to or larger than the width of the resonance of the cavity. Hence, a device fabricated with such a variation in its cavity thickness would not be acceptable for use at the designated wavelength.

Thus, it was recognized that a need existed for a more accurate and precise method of fabricating the multiple cavity layers of a surface-normal semiconductor optical device. It was apparent that such a method, if available, would increase the quality of the devices made thereby and improve the yield of the fabrication process.

SUMMARY OF THE INVENTION

In accordance with the principles of the present invention, the undoped layers of a multi-layer mirror structure of a surface-normal semiconductor optical cavity device are fabricated in a separate deposition reactor dedicated to that purpose alone. In practice, such a dedicated reactor can produce undoped mirror layers whose thicknesses are relatively constant over their entire extents. At least some of the mirror layers constitute a part of the optical cavity of the device. Subsequently, other doped and undoped layers constituting the remainder of the optical cavity are fabricated in another reactor whose capability to maintain a relatively invariant thickness over the entire extent of a layer is not as good as that of the dedicated reactor.

In accordance with the invention, it is advantageous to optically measure the actual achieved thickness of the aforementioned multi-layer mirror structure before depositing thereon the other doped and undoped layers of the cavity. As a result of the measurement, the overall thickness of those other layers can then be prescribed to be more or less than some prespecified nominal value. In that way, it is possible in effect to compensate for any overall thickness deviation that exists in the actual fabricated mirror structure. Due to this fabrication methodology, the resulting optical cavity of the device is more likely than heretofore to have an overall thickness that corresponds to a prespecified resonance wavelength. The yield of the fabrication process is thereby significantly improved.

In one aspect, the invention comprises a method for fabricating a semiconductor optical cavity device that includes at least one multi-layer mirror structure. In particular, the method comprises depositing, in a first reactor, undoped layers that constitute the mirror structure. At least some of these mirror layers constitute part of the overall thickness of the optical cavity. Subsequently, in a second reactor, doped and undoped layers constituting the remainder of the thickness of the optical cavity are deposited.

In another aspect, the invention comprises a unique semiconductor device having a multi-layer mirror structure and additional layers deposited thereon. The device is characterized in that the thickness variation from a prescribed value of each of the layers of the mirror structure over the entire extent of each mirror layer is less than the thickness variation that exists over the entire extent of each additional layer.

BRIEF DESCRIPTION OF THE DRAWING

A complete understanding of the present invention and of the above and other features and advantages thereof will be apparent from the detailed description below taken in conjunction with the accompanying drawing, in which.

DETAILED DESCRIPTION

For purposes of a particular example, emphasis herein will be directed to the fabrication of a specific illustrative asymmetric Fabry-Perot electroabsorptive light modulator. The general structure of such a modulator device is well known. What is unique and what will be described in detail below is an inventive and advantageous method for fabricating such devices in a high-yield manner. Moreover, as will be specified later below, the actual structure of devices made in accordance with the inventive method differs in particular respects from conventionally made such devices.

Figure 1:
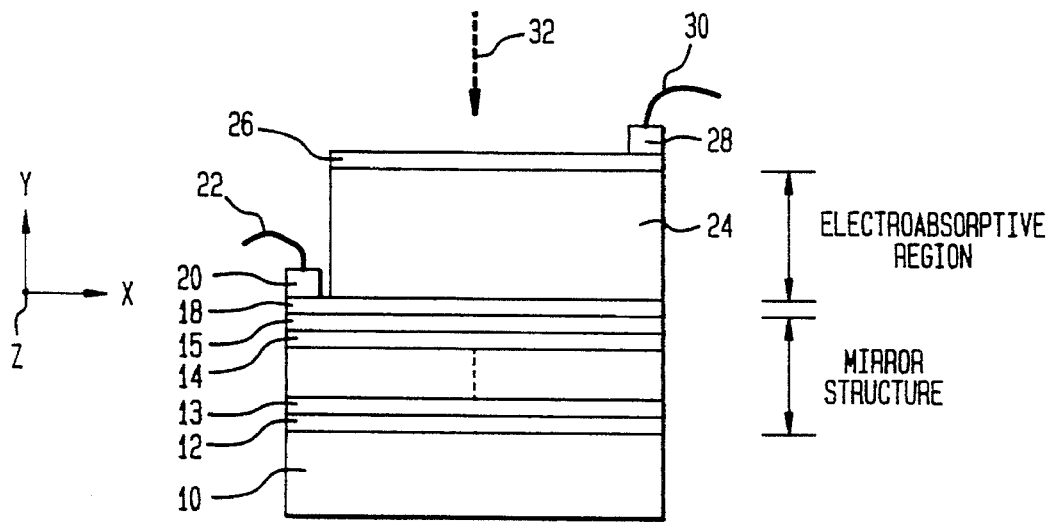
FIG. 1 is a representation in cross-section, not drawn to scale, of a specific illustrative surface-normal semiconductor optical cavity device made in accordance with the principles of the present invention.

The specific illustrative modulator device shown in FIG. 1 comprises a substrate 10 made, for example, of gallium arsenide (GaAs). The substrate 10 may be undoped. Or the substrate 10 may be doped with a suitable n-type dopant such as silicon. By way of example, the thickness or Y-direction dimension of the substrate 10 is about 500 micrometers (μm). Further, the index of refraction of the substrate 10 is approximately 3.6. In practice, it is generally advantageous to form on the substrate 10 of FIG. 1 an integrated-circuit assembly comprising multiple laser and/or modulator devices. Herein, so as to simplify the drawing and the accompanying description, only one optical cavity device of such an assembly is explicitly shown in FIG. 1.

In accordance with the principles of the present invention, multiple successive layers constituting a mirror structure are deposited in sequence on the top surface of the substrate 10. (This top surface is parallel to the X-Z plane depicted in FIG. 1.) Illustratively, the mirror structure comprises 15-to-30 such layers. Only the first and last two pairs of the multiple deposited mirror layers are explicitly shown in FIG. 1. The depicted first and last pairs of mirror layers are respectively designated in FIG. 1 by reference numerals 12, 13 and 14, 15.

The first deposited mirror layer 12 of FIG. 1 comprises, for example, a 713-μm-thick layer of aluminum gallium arsenide (AlGaAs) having an index of refraction of about 2.98. The second deposited layer 13 comprises, for example, a 607-μm-thick layer of aluminum arsenide (AlAs) having an index of refraction of approximately 3.5. Substantially identical additional layers of AlGaAs and AlAs are then repeatedly deposited in an interleaved fashion overlying the layer 13 to complete the mirror structure represented in FIG. 1.

In prior art devices of the general type shown in FIG. 1, the multiple layers of the mirror structure may each be doped or undoped. Herein, in accordance with the invention, only undoped mirror layers will be specified. Deposition of these undoped layers in a highly controlled manner in a dedicated reactor will be described later below.

For a modulator device designed to operate at a particular center optical wavelength, each layer of the mirror structure shown in FIG. 1 is fabricated to have a thickness equivalent to $\lambda/4n$, where $\lambda$ is the center optical wavelength of the device and n is the index of refraction of the layer. Such a multi-layer mirror structure is designed to be highly reflective to optical signals at the center wavelength.

Next, in a device made in accordance with the principles of the present invention, an optically transparent layer 18 made, for example, of doped AlGaAs is deposited on top of the top-most mirror layer 15 of FIG. 1. (In a prior art device in which the top-most layer 15 is doped, the additional layer 15 is not required.) The layer 15, which, illustratively, is doped with an n-type dopant such as silicon, serves as an electrically conductive layer that will be used in conjunction with a subsequently deposited conductive layer to apply electrical signals to the modulator device. By way of example, the thickness of the layer 18 is approximately 500 Angstrom units, and its index of refraction is 3.5. An electrical connection is made to the conductive layer 18 of FIG. 1 by means of contact 20. For the case in which the layer 18 is doped with an n-type dopant,, the contact 20 is made, for example, of a standard gold/germanium mixture. (For a layer 18 doped with a p-type dopant such as beryllium, the contact 20 is made, for example, of a conventional gold/zinc mixture.) In either case, an electrical lead 22 connects the contact 20 to a source (not shown) of electrical signals that are to modulate the optical signals applied to the depicted device. Overlying the layer 18 of the Fabry-Perot modulator device of FIG. 1 is an electroabsorptive region 24. Advantageously, as is well known in the art, the electroabsorptive region 24 comprises, for example, a conventional multiple-quantum-well (MQW) region that includes multiple layers. Illustratively, the region 24 comprises about fifty alternating layers of undoped GaAs and AlGaAs. By way of example, the region 24 is characterized by an index of refraction of 3.5.

As is well known, the resonance wavelength of the modulator device depicted in FIG. 1 is determined by the bandgap of the MQW region. In one particular example, the design of the region 24 is such that the resonance wavelength of the device is specified to be 850 nm. In that case, the optical signals to be directed at the device would have a center wavelength of 850 nm. And, as mentioned above, the aforedescribed mirror structure would be correspondingly designed to be highly reflective at this center wavelength and to exhibit, for example, an optical bandwidth of approximately 800-to-900 nm.

The top-most layer of the FIG. 1 device comprises another optically transparent and electrically conductive layer. This layer, which is designated in FIG. 1 by reference numeral 26, also comprises, for example, a 500-Angstrom unit-thick layer of doped AlGaAs having an index of refraction of 3.5. For the case in which the lower conductive layer 18 is n-doped, the upper layer 26 would be advantageously p-doped. On the other hand, if the lower layer 18 is p-doped, the upper layer 26 would be n-doped. In either case, an appropriate electrical contact 28 is made to the layer 26. In turn, an electrical lead 30 connects the contact 28 to the aforementioned source of electrical modulation signals. Optical signals to be modulated are directed at the FIG. 1 device approximately normal to the top surface of the layer 26. Such signals are schematically represented by dash line 32.

To ensure a high modulation efficiency, it is important that the thickness of the optical cavity of the FIG. 1 device be tightly controlled. Illustratively, the overall thickness of the cavity must be controlled to be less than plus or minus one percent of a prescribed value.

Since optical waves propagated in the FIG. 1 device actually extend into the mirror structure, the effective overall thickness of the optical cavity extends in the Y direction from the top of the layer 26 into the depicted mirror structure. In practice, the thickness of the cavity is defined by the relationship $m\lambda/2n$, where m is a positive integer, $\lambda$ is the center or resonance wavelength of the device as determined by the bandgap of the electroabsorptive region 24 and n is the index of refraction of the cavity, as is well known in the art.

The top-most layer 26 of FIG. 1 can in effect serve as the required top mirror of the depicted optical cavity device. In particular, reflection of a portion of the incident optical signal occurs at the interface between the top surface of the layer 26 and the medium (usually air) that overlies the device. The net resultant amount of light that is reflected back from the layer 26 and the lower mirror comprising the aforedescribed multi-layer mirror structure is a function of the electric field applied to the electroabsorptive region 24 included in the optical cavity. Thus, by applying a modulating electrical signal to the region 24 as described above, it is possible to control the amount of light that is reflected back from the device, as is well known in the art.

Heretofore, the layers 12,13 . . . 14,15 of the mirror structure, the conductive transparent layer 18, the layers of the electroabsorptive region 24 and the conductive transparent layer 26 shown in FIG. 1 would all be deposited in sequence in a single reactor such as a conventional molecular-beam-epitaxy (MBE) reactor. For the particular illustrative device described herein, such a reactor would have to include five different sources. Additionally, such a reactor must be designed to ensure relatively high doping accuracy and material purity. Moreover, if the device includes an MQW region, the typical requirement that the quantum wells of such a region have sharp interfaces imposes an additional constraint on the design of the reactor.

In practice, because of the aforementioned constraints imposed on the design of the deposition reactor by considerations such as multiple sources, material purity, doping accuracy, etc., the capability of such a reactor to deposit layers whose thicknesses are relatively invariant over their entire extents is limited. Thus, for example, the best that a typical such conventional reactor can do is to deposit layers each of whose thicknesses varies over its entire extent by at least plus or minus one percent from a prescribed thickness value. Accordingly, the thickness of the optical cavity of a conventional FIG. 1 device (i.e., the thickness of the MQW region 24 and any associated transparent layers plus the thickness of a portion of the depicted mirror structure) can also be controlled in practice only at the best to plus or minus one percent. As a result, the resonance wavelength of the cavity can actually vary by about one percent from a prespecified center wavelength. Such a variation (for example, 8.5 nm for a device designed to operate at 850 nm) can in many cases be comparable to or even greater than the width of the resonance of the device. For such a variation, the fabricated device would not be suitable for effective operation at the prespecified resonance wavelength. Thus, thickness variations of the type typically encountered heretofore lead in practice to low-yield and hence high-cost fabrication processes.

In accordance with the principles of the present invention, the multiple undoped layers of the mirror structure of the FIG. 1 device are fabricated in a reactor that is dedicated to that purpose alone. For the particular example specified above, such a reactor (for example, a standard MBE reactor) need include only three sources. This imposes fewer geometrical constraints on the design of the reactor than if more sources were needed. Moreover, since the undoped mirror structure is essentially a non-electrical component, considerations of material purity are substantially relaxed and the requirement of maintaining specified doping levels is non-existent.

For all these reasons, a conventional MBE reactor dedicated to the single purpose of fabricating only the relatively simple multi-layer mirror structure of FIG. 1 is capable of depositing individual layers each of whose thickness variations over its entire extent varies by considerably less than if a single more complicated MBE reactor were employed to make the mirror structure, the MQW region 24 and the associated transparent layers. In practice, a specific illustrative conventional MBE reactor dedicated only to the fabrication of the multi-layer mirror structure is capable of maintaining each such layer thickness over its entire extent within approximately at least plus or minus 0.5 percent from a prescribed value.

Subsequent to the fabrication of the mirror structure, the partially completed device is moved (for example, via a conventional load lock) from the dedicated reactor to a second conventional reactor in which the transparent layer 18, the MQW region 24 and the transparent layer 26 are sequentially deposited. As noted above, the best that a typical such more complicated second reactor can do is to deposit layers each of whose thicknesses varies over its entire extent by about plus or minus one percent from a prescribed thickness value. But, as will be shown later below in connection with the description of FIGS. 2 and 3, since at least a portion of the effective optical cavity (namely, the mirror structure) was deposited with considerably smaller-than-usual thickness variations, the variations in thickness from a prescribed value for the cavity will also be less than heretofore realized by conventional fabrication techniques. In practice, the actual shift in resonance wavelength for typical layer thickness variations in a modulator device made in this unique two-step fashion in two reactors is only about one-half that achieved in a single reactor in which the mirror structure, the electroabsorptive region and the layers 18 and 26 are all made. In accordance with the invention, the yield of acceptable devices is thereby greatly improved.

Another advantage of the herein-described two-step fabrication process is that it is feasible thereby to non-invasively measure the actual achieved thickness of the mirror structure of FIG. 1 before proceeding to form the electroabsorptive region 24 and the layers 18 and 26. This can be done easily and conveniently after removing the mirror structure from the first reactor and before placing it in the second reactor. Measurement is carried out, for example, using conventional optical reflectivity techniques. If such a measurement indicates that the actual thickness of the mirror structure fabricated in the dedicated reactor is less than or more than a prespecified value, the specified thickness of the region 24 and the layers 18 and 26 to be formed in the second reactor can be prescribed to be respectively more than or less than what it would have been if the thickness of the mirror structure had exactly matched its prespecified value. In that way, the final overall thickness of the optical cavity of the device is more likely to correspond to a prespecified resonance wavelength. The yield of acceptable devices is thereby further signficantly improved.

The inventive fabrication procedure specified herein is also applicable to the manufacture of other surface-normal semiconductor devices that include optical cavities. Thus, for example, the aforespecified two-step procedure can be utilized to make a conventional surface-emitting laser of the type described in "Low-Threshold Electrically Pumped Vertical-Cavity Surface-Emitting Microlasers", by J. L. Jewell et al, *Electronics Letters*, Vol. 25, No. 17, pages 1123–1124, Aug. 17, 1989. Such a laser includes a gain medium and a multi-layer mirror structure. The effective thickness of the optical cavity of the laser comprises the gain medium and at least a portion of the thickness of the mirror structure. Consequently, by making the mirror structure of such a laser in a dedicated reactor in the manner described above, it is feasible to realize an optical cavity characterized by smaller-than-normal variations in thickness from a prescribed value over its entire extent. The manufacturing yield of lasers designed to operate at a particular resonance wavelength is thereby significantly improved.

Figure 2:
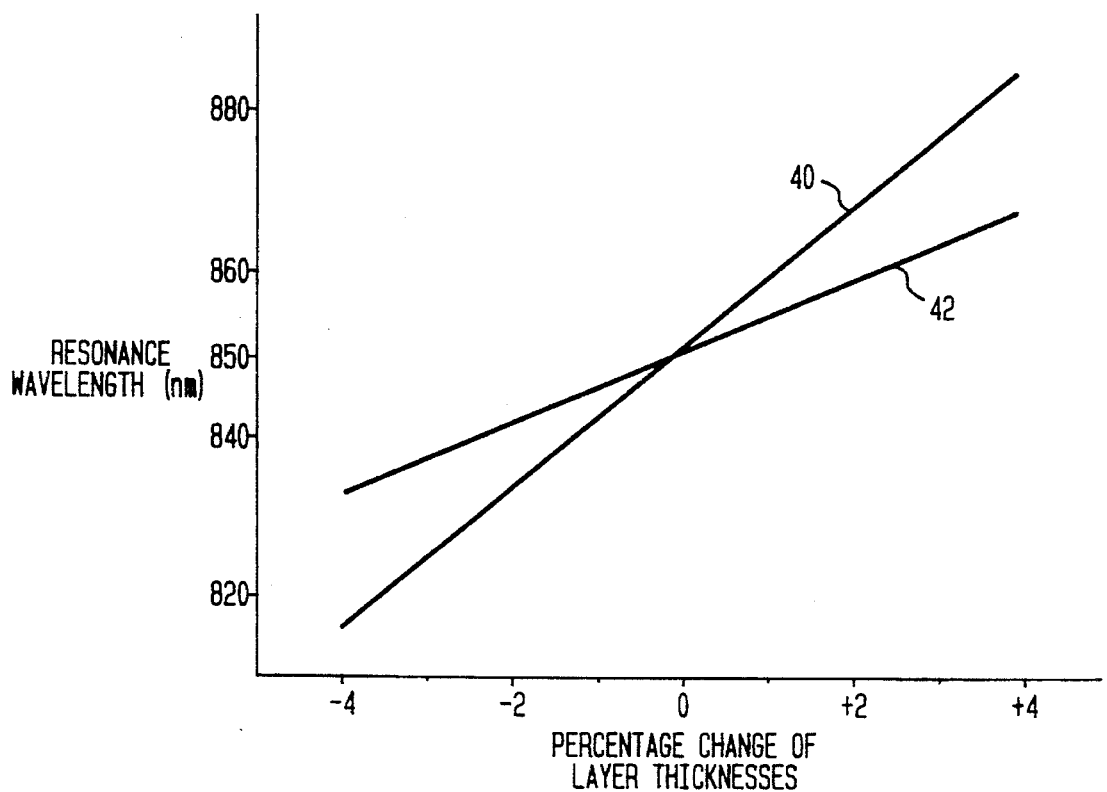
FIG. 2 is a graphical plot of resonance wavelength versus percentage change in layer thicknesses for the optical cavity of an asymmetric Fabry-Perot modulator.

The primary advantage of a Fabry-Perot modulator device made in accordance with the principles of the present invention is represented in FIG. 2, which is a plot of resonance wavelength of the device versus percentage change in layer thicknesses. The particular illustrative device to which the plot applies comprises in order from bottom to top a substrate having an index of refraction of 3.6; an initial 713-Angstrom unit-thick mirror layer having an index of refraction of 2.98 followed by fifteen pairs of mirror layers, each pair having 607- and 713-Angstrom unit-thick layers having indices of refraction of 3.5 and 2.98, respectively; a 300-Angstrom unit-thick doped transparent layer having an index of refraction of 3.5; a 3643-Angstrom unit-thick MQW region having an index of refraction of 3.5; and a top-most 300-Angstrom unit-thick doped transparent layer having an index of refraction of 3.5. Further, the particular device to which FIG. 2 applies is designed to have a center resonance frequency of 850 nm.

Line 40 in FIG. 2 shows the variation in resonance wavelength for various percentage changes in layer thicknesses if all the layers of the above-specified device are deposited in a conventional manner in a single reactor. As indicated, if all the layer thicknesses vary by a particular percentage, the resonance wavelength of the optical cavity made in the single reactor varies by approximately the same percentage.

By contrast, line 42 in FIG. 2 illustratively shows the variation in resonance wavelength for various percentage changes in layer thicknesses for a modulator device made in accordance with the principles of the present invention. Thus, line 42 is representative of a device whose mirror layers are made in a first relatively simple MBE reactor and whose other layers are made in a second more complicated MBE reactor, in the illustrative manner described in detail above. If, for example, the first reactor is capable of depositing layers whose thicknesses remain relatively constant over their entire extents, while the thicknesses of layers made in the second reactor vary at the best by about one percent over their entire extents, the measured shift in resonance wavelength (4.25 nm) for such an optical cavity made in accordance with the invention is only about one-half what it would be (8.5 nm) if all the layers were made in the second reactor.

Figure 3:
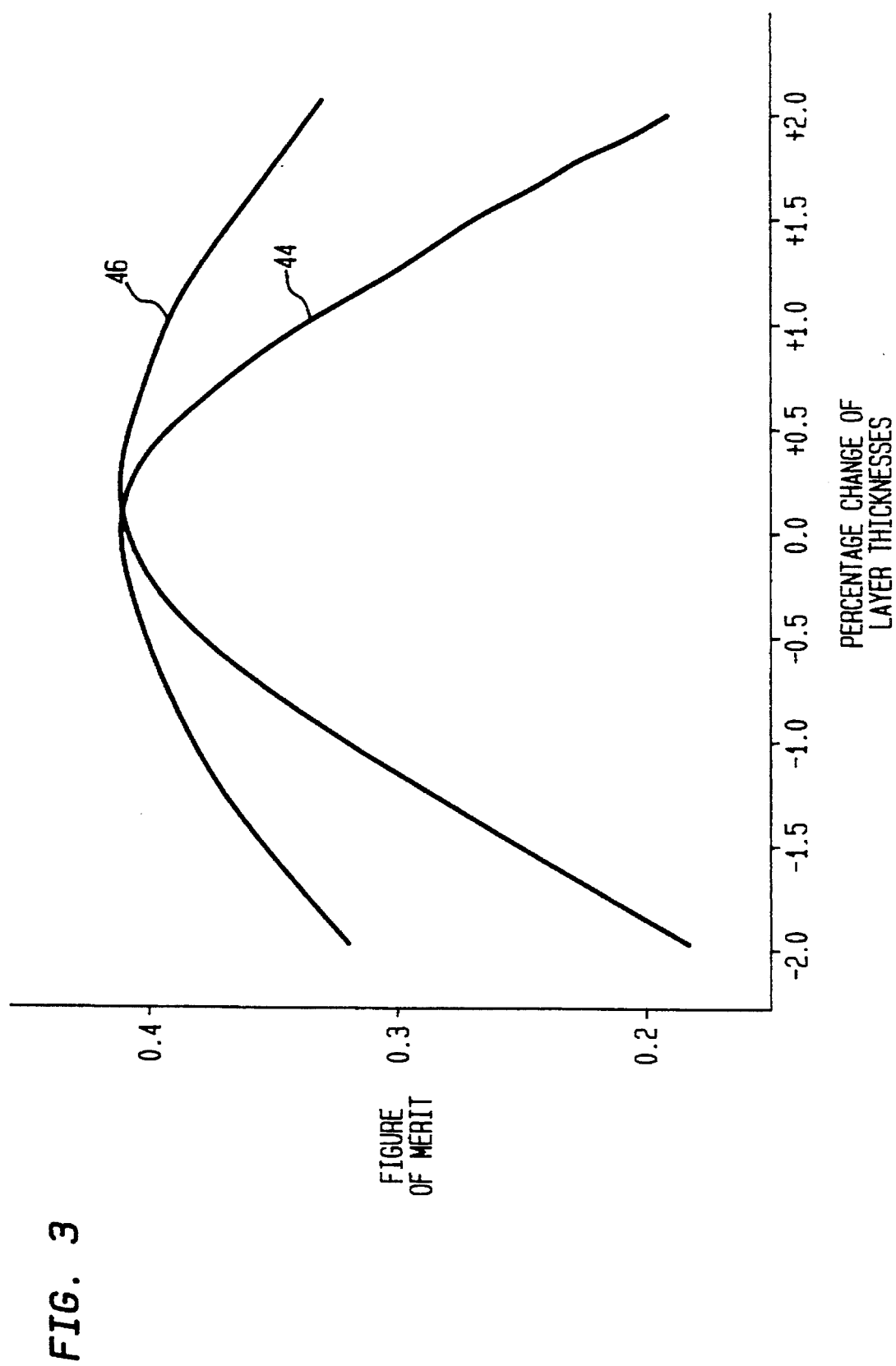
FIG. 3 is a graphical plot of figure of merit versus percentage change in layer thicknesses for the optical cavity of an asymmetric Fabry-Perot modulator.

FIG. 3 is a plot of the so-called figure of merit of a Fabry-Perot modulator device versus percentage change in layer thicknesses. As is well known, the figure of merit of such a device is defined as $(R_{ON}-R_{OFF}) \times (1-R_{OFF})$, where $R_{ON}$ is the net reflectivity of the device to incident light when an electric field is applied to the electroabsorptive region thereof, and $R_{OFF}$ is its net reflectivity when no electric field is applied to that region.

More specifically, the FIG. 3 plot is for a modulator device which comprises in order from bottom to top: a substrate having an index of refraction of 3.6; an initial 713-Angstrom unit-thick mirror layer having an index of refraction of 2.98 followed by sixteen pairs of mirror layers, each pair having 607- and 713-Angstrom unit-thick layers having indices of refraction of 3.5 and 2.98, respectively; a 300-Angstrom unit-thick doped transparent layer having an index of refraction of 3.5; a 3043-Angstrom unit-thick MQW region having an index of refraction of 3.5; and a top-most 300-Angstrom unit-thick doped transparent layer having an index of refraction of 3.5. Further, the device to which FIG. 3 applies is designed to have a center resonance wavelength of 850 nm.

Additionally, the MQW region of the particular modulator device represented by FIG. 3 is characterized by a so-called absorption coefficient $\alpha$. Illustratively, $\alpha$ varies between 0.25 and 1.0 1/μm for electric field values that respectively correspond to 0 and 1.8 volts applied to the MQW region. Line 44 in FIG. 3 shows the variation in figure of merit for various percentage changes in layer thicknesses if all the layers of the above-specified device are deposited in a conventional manner in a single reactor. As indicated, if all the layer thicknesses change by, for example, one percent, the figure of merit is reduced from 0.4 to about 0.32.

By contrast, line 46 in FIG. 3 shows the variations in figure of merit for various percentage changes in layer thicknesses for a modulator device of the particular type specified above and made in accordance with the principles of the present invention. Thus, line 46 is representative of a device whose mirror layers are made in a first relatively simple MBE reactor and whose other layers are made in a second more complicated MBE reactor, in the illustrative manner described in detail earlier above. If, for example, the first reactor is capable of depositing layers whose thicknesses remain relatively constant over their entire extents, while the thicknesses of layers made in the second reactor vary by about one percent over their entire extent, the figure of merit for such a device made in accordance with the invention is reduced from 0.4 to only about 0.38.

As specified in detail herein, a device made in accordance with the principles of the present invention is fabricated in a unique two-step manufacturing procedure. By selecting reactors appropriate for the respective steps, greater control over layer thickness is achieved in the first step during which the layers of the mirror structure are made than in the second step during which the other layers of the device are made. Thus, in practice, the variation in thickness of the mirror layers of a device made in accordance with the invention is different from the variation in thickness of the other layers of the device. This structural difference can actually be observed and measured in a completed device.

Finally, it is to be understood that the above-described techniques and arrangements are only illustrative of the principles of the present invention. In accordance with these principles, numerous modifications and alternatives may be devised by those skilled in the art without departing from the spirit and scope of the invention. Thus, for example, a conventional multi-layer dielectric mirror structure can be utilized as the top mirror in a device of the type shown in FIG. 1. By fabricating such a mirror structure in a dedicated reactor of the type employed to make the aforementioned lower mirror structure, extremely excellent control and uniformity of the layer thicknesses of the upper mirror structure over their entire extents can in practice be achieved. The addition of such an upper mirror structure to the device is effective to provide an even greater tolerance in the manufacturing process to inevitable thickness variations that occur in the reactor in which the other (non-mirror) layers are fabricated.

What is claimed is:

1. A method for fabricating a semiconductor optical cavity device that includes at least one multi-layer mirror structure that consists only of undoped layers, said method comprising the steps of in a first reactor adapted to deposit only undoped layers whose thickness variations over their entire extents are less than the thickness variations over their entire extents of layers deposited in a second reactor, successively depositing the undoped layers that constitute said mirror structure, at least some of the layers of said mirror structure being included in the overall thickness of the optical cavity of the device, and, in said second reactor, successively depositing undoped and doped layers that constitute the remainder of the thickness of said optical cavity, wherein each of the layers deposited in said first reactor is characterized by thickness variations over its entire extent that are less than the thickness variations of layers deposited in said second reactor.

2. A method as in claim 1 further comprising the step of measuring the actual overall thickness of the deposited layers of said mirror structure before depositing thereon the remaining layers constituting said optical cavity.

3. A method as in claim 2 wherein the overall thickness of the layers to be deposited in said second reactor is increased or decreased, respectively, depending on whether the actual achieved overall thickness of said mirror structure is measured to be less than or more than a prescribed thickness value.

4. A method as in claim 3 wherein said device comprises a surface-normal semiconductor optical cavity device.

5. A method as is claim 4 wherein said device comprises an asymmetric Fabry-Perot modulator.

6. A method as in claim 5 wherein some of the layers deposited in said second reactor constitute an electroabsorptive region.

7. A method as in claim 6 wherein said electroabsorptive region comprises an MQW region.

8. A method as in claim 4 wherein said device comprises a surface-emitting laser.

9. A method as in claim 8 wherein some of the layers deposited in said second reactor constitute a gain region.

10. A method as in claim 4 wherein the layers of said mirror structure comprise alternating undoped layers of AlGaAs and AlAs each having a prescribed thickness of $\lambda/4n$, where $\lambda$ is the center resonance wavelength of the optical cavity of the device and n is the index of refraction of the layer material.

11. A method as in claim 1 wherein said first reactor is capable of maintaining the thickness over the entire extent of each undoped layer deposited therein within approximately at least plus or minus 0.5 percent from a prescribed thickness value, and wherein said second reactor is capable of maintaining the thickness over the entire extent of each layer deposited therein within about plus or minus one percent from a prescribed thickness value.

* * * * *